US007901990B2

(12) United States Patent
Letterman, Jr. et al.

(10) Patent No.: US 7,901,990 B2
(45) Date of Patent: *Mar. 8, 2011

(54) METHOD OF FORMING A MOLDED ARRAY PACKAGE DEVICE HAVING AN EXPOSED TAB AND STRUCTURE

(75) Inventors: James P. Letterman, Jr., Mesa, AZ (US); Kent L. Kime, Phoenix, AZ (US); Joseph K. Fauty, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/553,706

(22) Filed: Sep. 3, 2009

(65) Prior Publication Data

US 2010/0019367 A1    Jan. 28, 2010

Related U.S. Application Data

(62) Division of application No. 11/243,195, filed on Oct. 5, 2005, now Pat. No. 7,602,054.

(51) Int. Cl.
*H01L 23/52* (2006.01)
*H01L 21/78* (2006.01)
*H01L 23/48* (2006.01)

(52) U.S. Cl. ......... 438/112; 257/685; 257/E21.599; 257/E23.116; 257/E23.141; 438/111; 438/123; 438/124; 438/127

(58) Field of Classification Search ............ 257/685, 257/E23.116, E21.599, E23.141; 438/111, 438/112, 123, 124, 127
See application file for complete search history.

(56) References Cited

U.S. PATENT DOCUMENTS

| 4,043,027 | A | * | 8/1977 | Birchler et al. ........... 438/112 |
| 4,900,501 | A | * | 2/1990 | Saeki et al. ............ 264/272.17 |
| 5,349,233 | A | * | 9/1994 | Sasaki .................... 257/666 |
| 5,659,950 | A | * | 8/1997 | Adams et al. .............. 29/827 |
| 6,157,050 | A | * | 12/2000 | Fukuoka .................. 257/82 |
| 6,689,642 | B2 | * | 2/2004 | Fukuda ................... 438/122 |

* cited by examiner

*Primary Examiner* — Eugene Lee
*Assistant Examiner* — Peniel M Gumedzoe
(74) *Attorney, Agent, or Firm* — Kevin B. Jackson

(57) ABSTRACT

In one embodiment, a method for forming a molded flat pack style package includes attaching electronic chips to an array lead frame, which includes a plurality of elongated flag portions with tab portions and a plurality of leads. The method further includes connecting the electronic chips to specific leads, and then molding the array lead frame while leaving portions of the leads exposed to form a molded array structure. The molded array structure is then separated to provide molded flat pack style packages having exposed leads for insertion mount and exposed tab portions. In an alternative embodiment, the separation step produces a no-lead configuration with exposed tab portions.

11 Claims, 13 Drawing Sheets

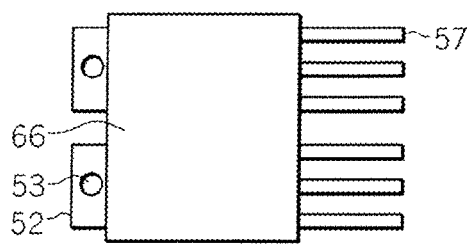
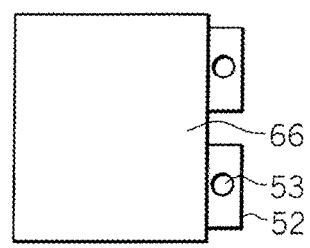
FIG. 9          FIG. 10
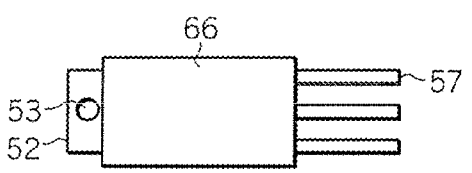
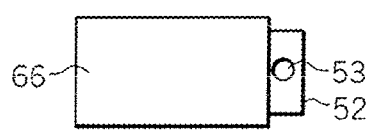
FIG. 11          FIG. 12
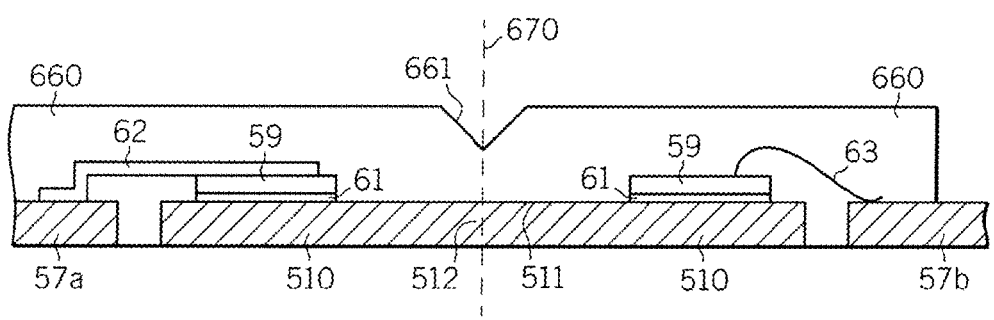
FIG. 13
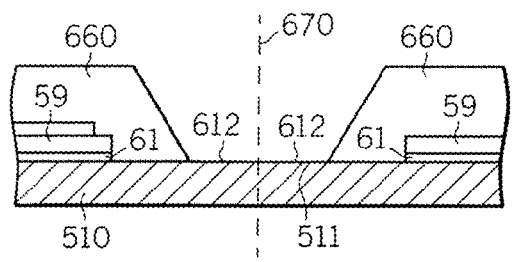
FIG. 14

METHOD OF FORMING A MOLDED ARRAY PACKAGE DEVICE HAVING AN EXPOSED TAB AND STRUCTURE

The present application is a divisional of U.S. application Ser. No. 11/243,195 filed on Oct. 5, 2005 now U.S. Pat. No. 7,602,054, which issued on Oct. 13, 2009, and priority thereto is hereby claimed.

FIELD OF THE INVENTION

This invention relates generally to electronic devices, and more specifically to power semiconductor packages and methods of assembly.

BACKGROUND OF THE INVENTION

The handheld consumer products market is aggressive in the miniaturization of portable electronics. Primarily driven at present by the cellular phone and digital assistant markets, manufacturers of these devices are challenged by ever shrinking formats and the demand for more PC-like functionality. This challenge asserts pressure on surface mount component manufacturers to design their products to command the smallest area possible. By doing so, this allows portable electronics designers to incorporate additional functions within a device without increasing the overall product size.

In Chip Scale Packaging (CSP) technologies, manufacturers strive to bring the package size as close as possible to the size of the semiconductor chip. The electronics industry has accepted the Joint Electronic Device Engineering Council (JEDEC) defined Quad Flat Pack (QFP) and Quad Flat Pack No Lead (QFN) outlines as good alternatives for low cost chip scale packages. In typical QFP and QFN packages, the lower surface of a semiconductor chip is attached to a metal lead frame. Wire bonds are then used to connect circuitry located on the front side of the chip to individual leads on the lead frame. The chip and lead frame are subsequently encapsulated by an epoxy resin to form an assembled component.

FIG. 1 shows a partial cross-sectional view of a conventional QFP package 10 including a lead frame 11. Lead frame 11 includes a flag portion 13 for supporting a semiconductor chip 14 and a lead 16. A wire bond 17 connects semiconductor chip 14 to lead 16. An epoxy layer 19 covers semiconductor chip 14 and lead frame 11 except for portions of lead 16, which extend in a gull wing shape from the sides of the package. Although only a portion of QFP package 10 is shown, QFP packages typically are square or rectangular with leads 16 extending from all four sides of the package.

FIG. 2 shows a partial cross-sectional view of a conventional QFN package 20 including lead frame 21. Lead frame 21 comprises a flag portion 23 for supporting semiconductor chip 14, and leads 26. Wire bond 17 connects semiconductor chip 14 to a lead 26. Epoxy layer 19 covers semiconductor chip 14 and portions of lead frame 21, while leaving lower portions of flag 23 and lead 26 exposed. In the QFN package, the leads (e.g., lead 26) terminate at the edge of the package to provide a smaller package footprint. Although only a portion of QFN package 20 is shown, QFN packages typically are square or rectangular with leads 26 present on all four sides of the lower surface of the package. FIG. 3 shows an isometric and cut-away view of device 20. The Dual Flat No Lead (DFN) package is another chip scale package similar to the QFN except that the DFN only has leads on two opposing sides of the lower surface of the package.

There are several advantages to QFP, QFN, and DFN packages including large die size to package footprint ratio, matrix lead frame arrays that allow for easier assembly, and established automated assembly tools. However, there are several problems associated with these packages including poor heat transfer capability for high power device applications and very limited mounting options for attaching the packages to next levels of assembly including heat sinks and printed circuit boards.

Accordingly, a need exists for a package structure and method of assembly that is manufacturable on existing chip scale assembly platforms that use lead frames (e.g., QFP/QFN/DFN platforms), that supports high power applications, that supports multiple die options, and that has more flexible attachment options for connecting to next levels of assembly.

BRIEF DESCRIPTION OF THE DRAWINGS

FIG. 9 illustrates a top view of a tab mount molded array package in accordance with one embodiment of the present invention;

FIG. 10 illustrates a top view of a tab mount molded array package in accordance with another embodiment of the present invention;

FIG. 11 illustrates a top view of a tab mount molded array package in accordance with a further embodiment of the present invention;

FIG. 12 illustrates a top view of a tab mount molded array package in accordance with still further embodiment of the present invention;

FIG. 13 illustrates a cross-sectional view of a molded array package structure in accordance with a further embodiment of the present invention at an intermediate step in fabrication;

FIG. 14 illustrates a cross-sectional view of a molded array package structure in accordance with a still further embodiment of the present invention at an intermediate step in fabrication;

DETAILED DESCRIPTION OF THE DRAWINGS

Figure 1:
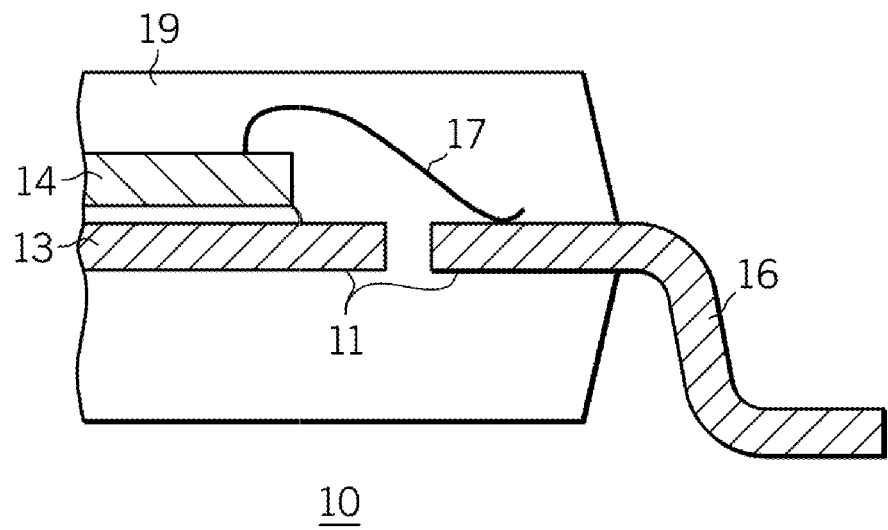
FIG. 1 illustrates a partial cross-sectional view of a prior art Quad Flat Pack (QFP) package.
Figure 2:
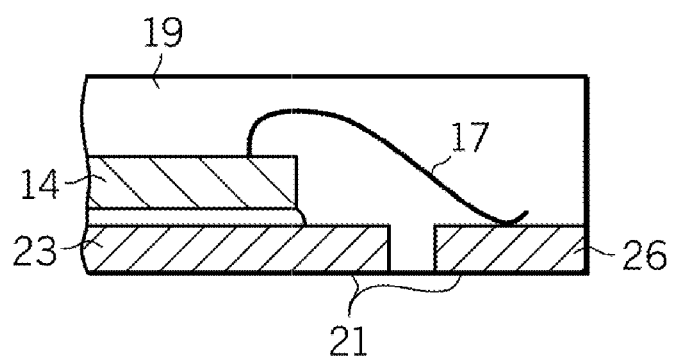
FIG. 2 illustrates a partial cross-sectional view of a prior art Quad Flat Pack No Lead (QFN) package.
Figure 3:
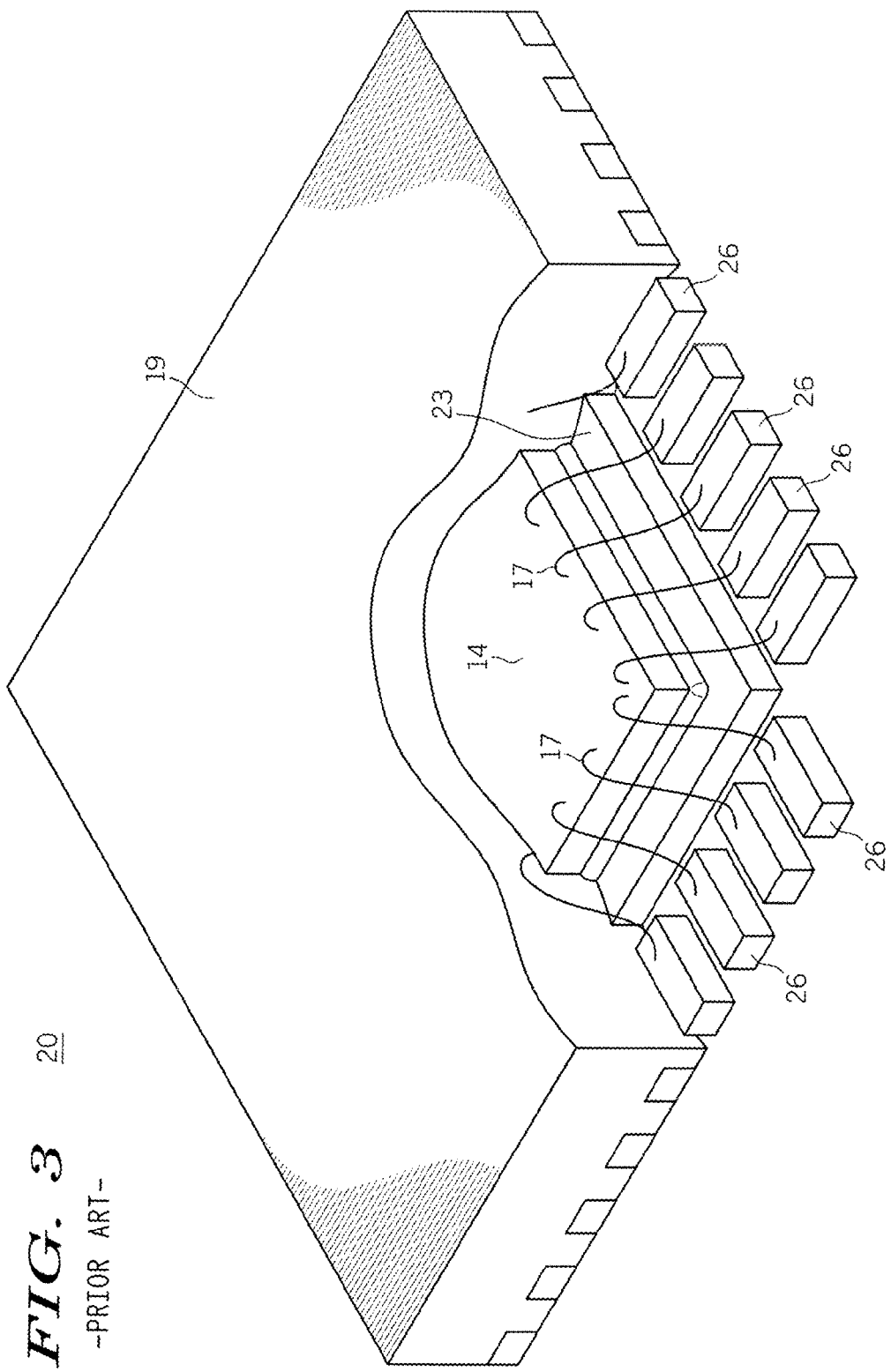
FIG. 3 illustrates an isometric and cut-away view of the QFN package of FIG. 2.

For ease of understanding, elements in the drawing figures are not necessarily drawn to scale, and like element numbers are used where appropriate throughout the various figures to denote the same or similar elements.

Figure 4:
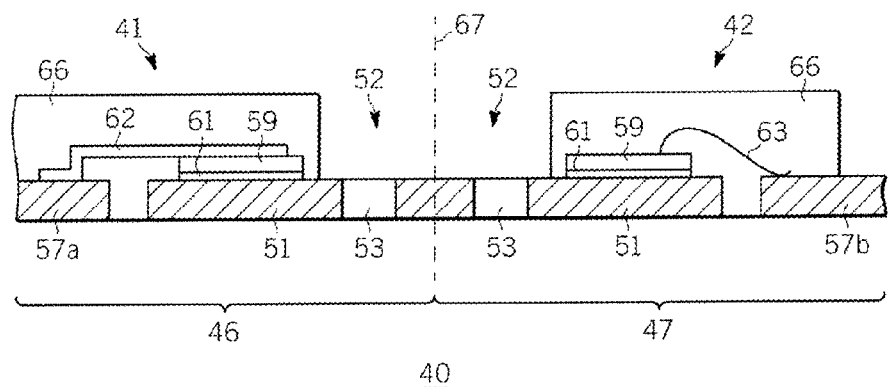
FIG. 4 illustrates a cross-sectional view of a molded array package in accordance with the present invention.

FIG. 4 shows a cross-sectional view of a molded array package, molded structure, flat pack structure, or packaged assembly 40 in accordance with the present invention. Packaged assembly 40 is shown with two examples of molded devices 41 and 42. Both devices 41 and 42 include lead frames or conductive lead frames 46 and 47 respectively. Lead frames 46 and 47 each have a flag portion or die attach paddle 51, which includes an exposed tab 52. Tab 52 is an exposed feature or projection that is integral with flag portion 51, and is provided for attaching devices 41 and 42 to next levels of assembly including, but not limited to, heat sinks, cabinets, printed circuit boards, or the like. In the embodiments shown, exposed tabs 52 are provided with optional through-holes 53.

Conductive lead frame 46 further includes a conductive lead 57a that is formed in a no-lead or leadless configuration, which will be explained in more detail below in accordance with the present invention. Conductive lead 47 includes a conductive lead 57b that is formed in a leaded or insertion mount configuration, which will be explained in more detail below in accordance with the present invention.

Devices 41 and 42 each include an electronic chip or device 59 attached to flag portions 51 with an attach layer 61. By way of example, electronic chips 59 may comprise power MOSFETS, bipolar power transistors, insulated gate bipolar transistors, thyristors, diodes, sensors, optical devices, and may further include integrated logic devices or other functionality. By way of further example, attach layer 61 comprises a solder or a high conductivity epoxy material.

Connective structures electrically connect electronic chips 59 to the conductive leads. For example, a conductive clip or strap 62 couples electronic chip of device 41 to conductive lead 57a, and a wire bond 63 couples electronic chip 59 of device 42 to conductive lead 57b. When a clip or strap is used, a solder or conductive epoxy is suitable for attaching the clip or strap to lead 57a and electronic chip 59.

An encapsulating layer 66 encloses or covers portions of devices 41 and 42, but does not cover exposed tab portions 52, through-holes 53 or leads 57b. By way of example, encapsulating layer 66 comprises a plastic epoxy resin material. Dashed line 67 represents one separation line for singulating devices 41 and 42 into individual devices in a subsequent step.

Figure 5:
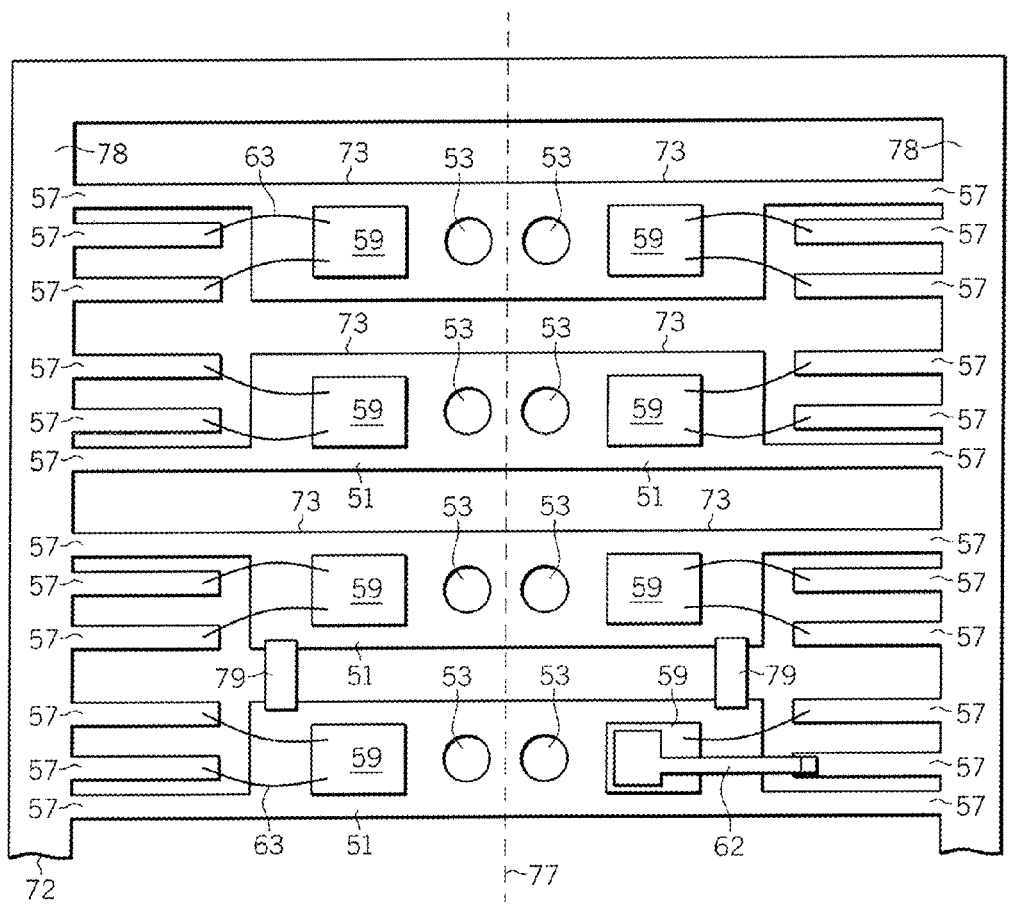
FIG. 5 illustrates a partial top view of an assembly structure in accordance with the present invention at an intermediate stage of fabrication.

FIG. 5 shows a partial top view of an assembly structure or sub-assembly 71 in accordance with the present invention at an intermediate stage of fabrication. Structure 71 includes an array lead frame or main lead frame 72. By way of example, main lead frame 72 comprises a single gauge chemically milled or stamped sheet of a material such as a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such nickel-palladium and gold. Again by way of example, main lead frame 72 is configured to be compatible with standard quad flat packaging assembly tools.

Main lead frame 72 includes an array or plurality of flags, elongated flag portions, or die attach paddles 51. Electronic chips 59 are attached to flag portions 51, and are further connected or coupled to plurality of leads 57 using, for example, connective wires or wire bonds 63 or conductive clips 62. By way of example, electronic chips 59 are placed onto elongated flags 51 using an automated/programmable pick and place tool. In an early step, a solder paste or epoxy film is placed onto elongated flags 51 to provide attach layer 61, and electronic chips 59 are then placed onto attach layers 61. The assembly is then placed through a curing process to cure or reflow attach layer 61 to form a conductive bond between electronic chip 59 and elongated flag portion 51. Alternatively, main lead frame 72 is pre-plated with solder or is pre-coated with a conductive epoxy. Optionally, electronic chips 59 include a solder attach layer such as an electroplated Pb/Sn layer or an epoxy layer formed on one surface, and are applied, for example, in wafer form.

Flag portions 51 further include tab portions 52 with through-holes 53. In one embodiment, each flag portion 51 includes two through-holes 53, which are on opposite sides of a center line 77 of main lead frame 72, which is also an example of separation line 67 shown in FIG. 4. In one embodiment, leads 57 are adjacent outer portions 78 of main lead frame 72, and main lead frame 72 is formed or provided without, free of, or independent of epoxy mold dam-bars. Additionally, main lead frame 72 is provided or formed so that the top surfaces of leads 57 are substantially co-planar or essentially flat as practical with the top surfaces of flag portions 51 as shown in FIG. 4. In an optional embodiment, coupling devices 79 are attached between adjacent flags 51 as shown in FIG. 5. By way of example, coupling devices 79 comprise capacitive devices that provide protection against electrostatic discharge events.

Figure 6:
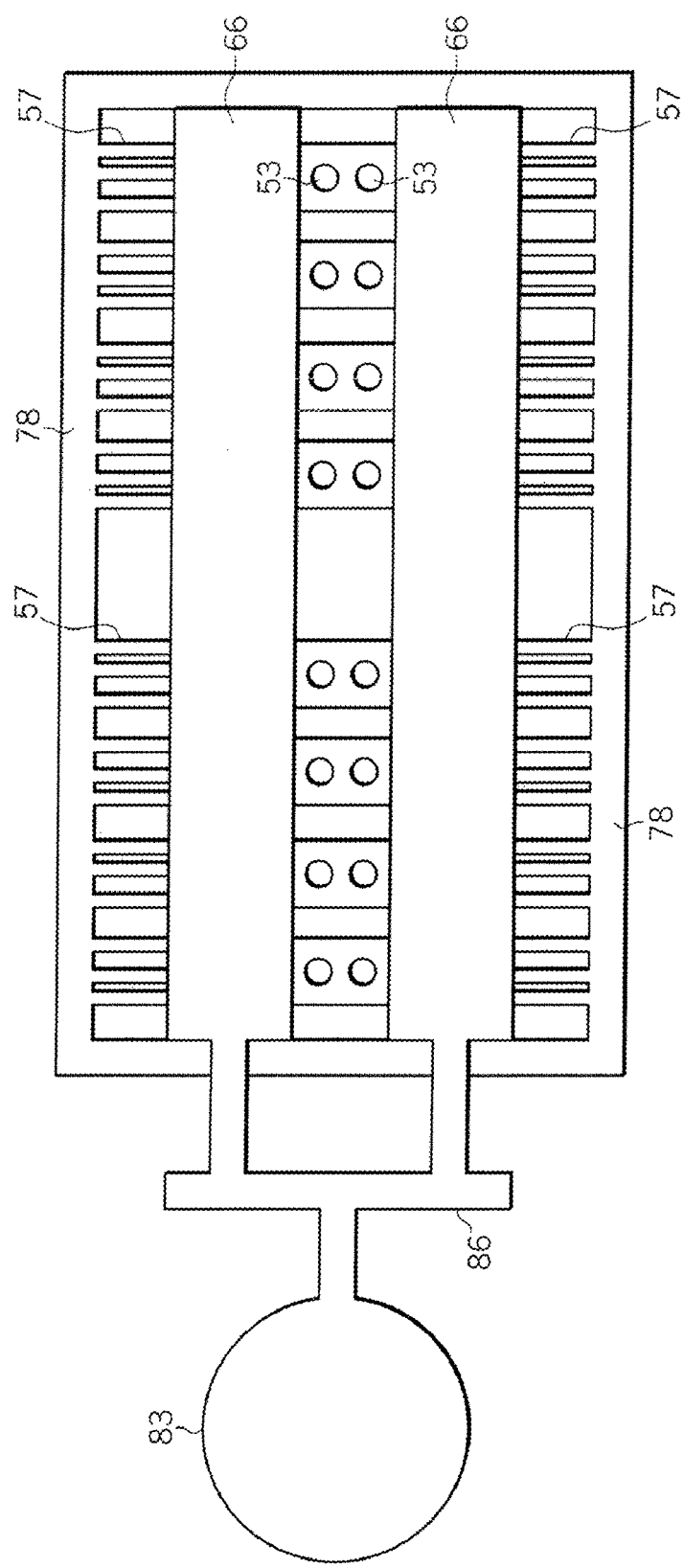
FIG. 6 illustrates a top view of the assembly structure of FIG. 5 during further processing in accordance with the present invention.

FIG. 6 shows a top view of assembly structure 71 during further processing in accordance with the present invention. In this step, assembly structure 71 is placed in a molding apparatus such as a transfer molding device. A solid resin pellet is placed in cull or pot 83. When pot 83 is heated to melt the solid resin pellet, the liquefied resin material is forced from pot 83 through runners 86 into the slot mold cavities to form a continuous encapsulating layer or encapsulating layer 66, while leaving portions of leads 57, tabs 52 and through-holes 53 exposed or un-encapsulated in accordance with an embodiment of the present invention. It is understood that in one embodiment, the lower surfaces (i.e., the surfaces opposite the surfaces electronic chips 59 are mounted on) of flags 51 and leads 57 are not encapsulated to provide electrical contact or connection in subsequent assembly operations.

Figure 7:
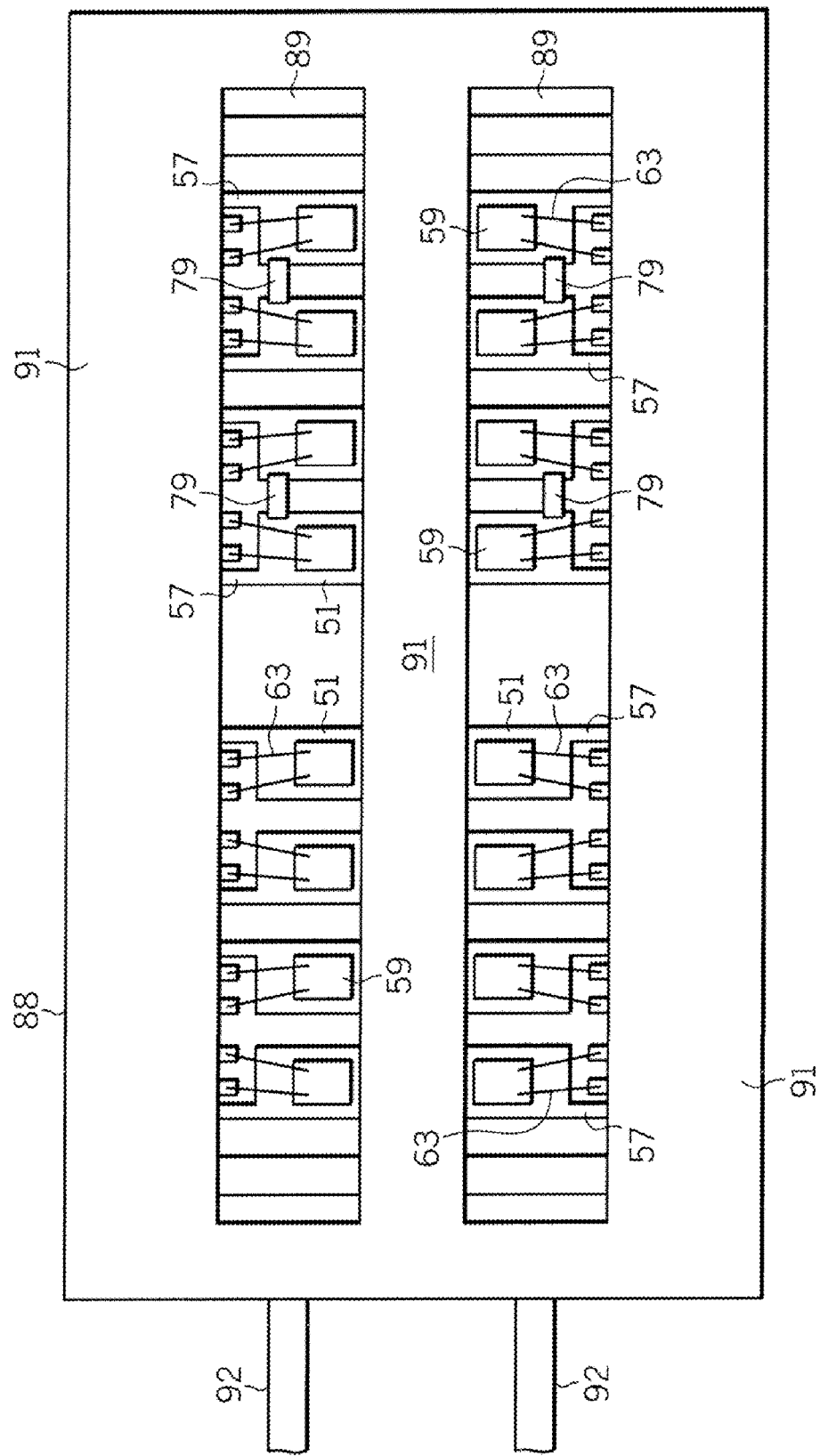
FIG. 7 illustrates a top view of an outline of a mold cap design for encapsulating the assembly structure of FIG. 5 in accordance with the present invention.

FIG. 7 shows a top view of an example of an outline of a mold cap design 88 for use with the present invention for forming slot molded array package (MAP) assemblies. Mold cap 88 includes cavities 89 that hold portions of flags 51 and portions of leads 57. Mold cap 88 further includes solid portions 91 that cover or contact other portions of leads 57 and other portions of flags 51 so that these portions are not encapsulated. Arrows 92 represent an example of a flow direction of encapsulating material during the molding process.

Figure 8:
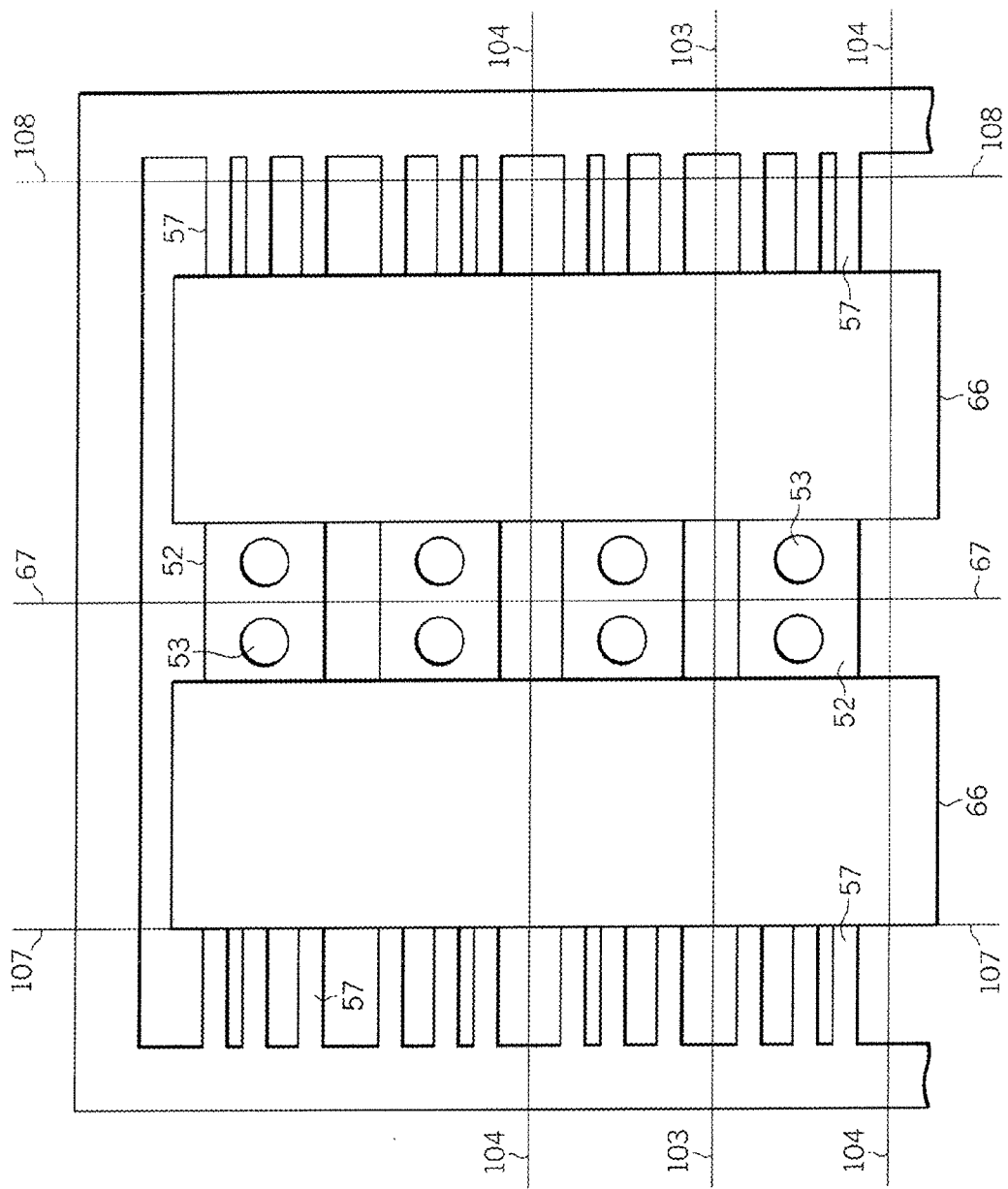
FIG. 8 illustrates a top view of the assembly structures of FIGS. 6 and 7 after further processing in accordance with the present invention.

FIG. 8 shows a top view of molded array package assembly 40 in accordance with the present invention that comprises an encapsulated or passivated assembly structure 71. Package assembly 40 includes a plurality of exposed leads 57 and a plurality of exposed tabs 52 with through-holes 53. Singulation lines 67, 103, 104, 107, and 108 represent optional separation sites for separating molded array package assembly 40 into separate molded array packages or structures in accordance with the present invention.

Lines 103 are horizontal or first directional cut lines that provide single molded array packages including packages 41 and 42 shown in FIGS. 11 and 12. Line 104 is a horizontal or first directional cut line that provides multi-chip molded array packages including packages 410 and 420 shown in FIGS. 9 and 10. Line 67 represents a vertical or second directional cut line through elongated flag portions 51. Line 107 represents a vertical or second directional cut line that provides a tab mount flat pack no lead molded array package such as packages 420 and 42 shown in FIGS. 10 and 12. Line 108 represents a vertical or second directional cut line that provides a tab mount flat pack leaded or single leaded (i.e., leads on one side only) molded array package such as packages 410 and 41 shown in FIGS. 9 and 11. Leaded packages 41 and 410 have exposed leads extending outwardly to provide a package style compatible with insertion mount PC board level assembly capabilities. Molded array package assembly 40 is separated into the possible individual packages described using, for example, conventional dicing, sawing, or laser cutting techniques. Once separated, packages 41, 42, 410, and 420 have singulated encapsulation layers 66, which are encapsulation layers that have been physically cut through as opposed to cavity molded layers.

FIG. 13 shows a cross-sectional view of a molded array package, molded structure, flat pack structure, or packaged assembly 400 in accordance with a further embodiment of the present invention. Packaged assembly 400 is similar to packaged assembly 40 except that elongated flag or die attach paddle 510 does not have horizontal exposed tabs with through-holes because an encapsulating layer 660 covers upper surface 511 of elongated flag 510. In an optional embodiment, encapsulating layer 660 is formed with a notch or groove 661, which after separation along line 670 provides a structure for holding or mounting a clip style heat sink. After separation along line 670, a vertical exposed tab portion 512 is provided that corresponds to an exposed substantially vertical face of flag portion 510.

FIG. 14 is a partial cross-sectional view of a molded array package, molded structure, flat pack structure, or packaged assembly 401 in accordance with a still further embodiment of the present invention. Packaged assembly 401 is similar to packaged assembly 400 except that encapsulating layer 660 does not cover all of upper surface 511 thereby leaving horizontal exposed tab portions 612. Tab portions 612 do not include through-holes, and provide for a convenient way to clip the package to a next level of assembly.

Figure 15:
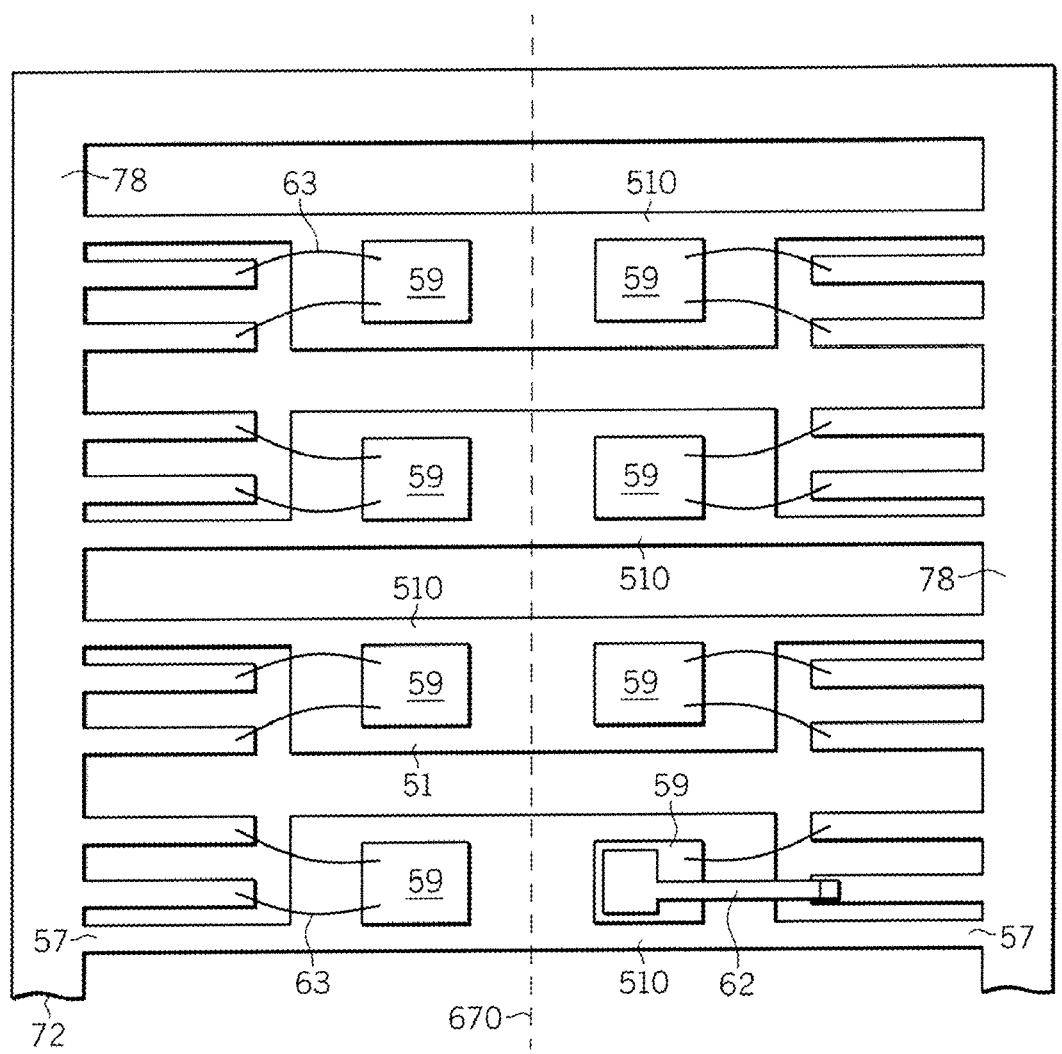
FIG. 15 illustrates an assembly structure for manufacturing the packages of FIG. 13 and FIG. 14 at an earlier step in fabrication in accordance with the present invention.

FIG. 15 shows a partial top view of an assembly structure or sub-assembly 710 in accordance with the present invention at an intermediate stage of fabrication. Structure 710 is similar to structure 71 shown in FIG. 5, except that elongated flags or flag portions 510 (similar structure 51 in FIG. 5) are provided without through-holes. Line 670 is shown as a vertical separation line as an example of a location for cutting through elongated flag portions 510 after assembly structure 710 is encapsulated using a process similar to that set forth above in conjunction with FIGS. 6-7.

Figure 16:
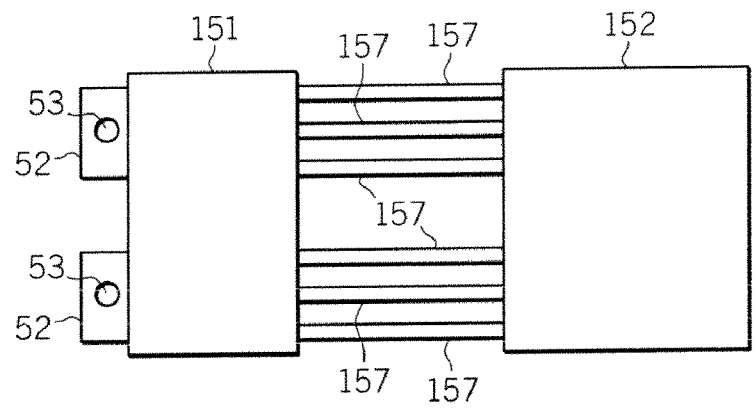
FIG. 16 illustrates a top view of a multi-chip molded array package having a tab mound in accordance with the present invention.

FIG. 16 shows a top view of an integrated multi-chip molded array package 150 having a separate molded first device or power device portion 151 directly connected to a second molded device portion 152 by conductive leads 157 in accordance with the present invention. Molded power device portion 151 comprises a single or multiple chip packages similar to packages 41 and 410 shown in FIG. 9 or 11, and includes tab portions 52 with through-holes 53. Second molded device portion 152 comprises, for example, a molded array packaged logic, sensor, memory, optical circuit device or combination thereof, and is connected to power device portion 151 by exposed or flexible conductive leads 157 extending between the two portions. In this embodiment, second molded device portion 152 further includes leadless connective portions for coupling or connecting to a next level of assembly. Examples of such connective portions are shown as portion 57a in FIG. 4.

Figure 17:
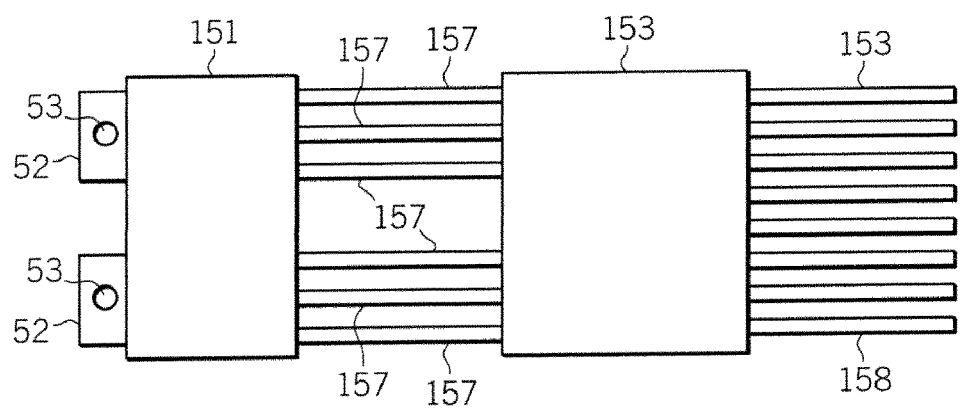
FIG. 17 illustrates a top view of a multi-chip molded array package having a tab mount in accordance with another embodiment of the present invention.

FIG. 17 shows a top view of an integrated multi-chip molded array package 160 having a separate molded first device or power device portion 151 directly connected to a second molded device portion 153 by conductive leads 157 in accordance with another embodiment of the present invention. Package 160 is similar to package 150 except that second molded device portion 153 further includes external, exposed, or outwardly extending conductive leads 158 for connecting or coupling to a next level of assembly. Conductive leads 158 may be used in place of leadless connective portions (e.g., portions 57a shown in FIG. 4) or in addition thereto.

Figure 18:
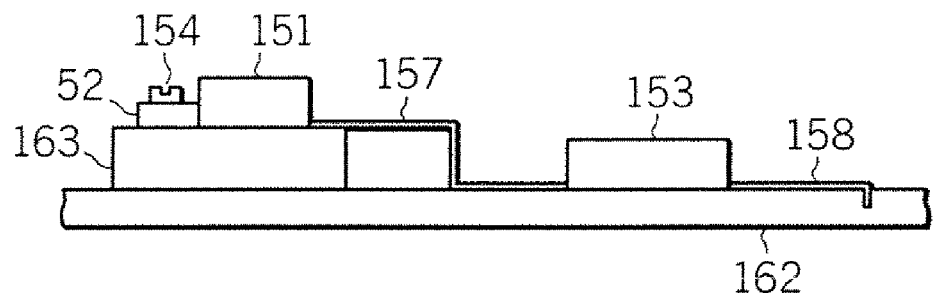
FIG. 18 illustrates a side view of the multi-chip molded array package of FIG. 17 attached to a next level of assembly in accordance with the present invention.

Packages 150 and 160 in accordance with the present invention provide for a flexible or bendable three dimensional array that is compatible with a variety of heat sinking techniques for power device portion 151. For example, FIG. 18 shows a side view of package 150 attached to a next level of assembly 162 in accordance with the present invention. In this embodiment, leads 157 are bent or shaped so that a heat sink device 163 is placed between power device portion 151 and assembly 162, which provides a way to more effectively cool power device portion 151. Tab portion 52 having through-hole 53 provides an attachment means for connecting power device portion 151 to heat sink device 163. By way of example, a pin, clip, screw 154 or the like is used for such purposes.

Figure 19:
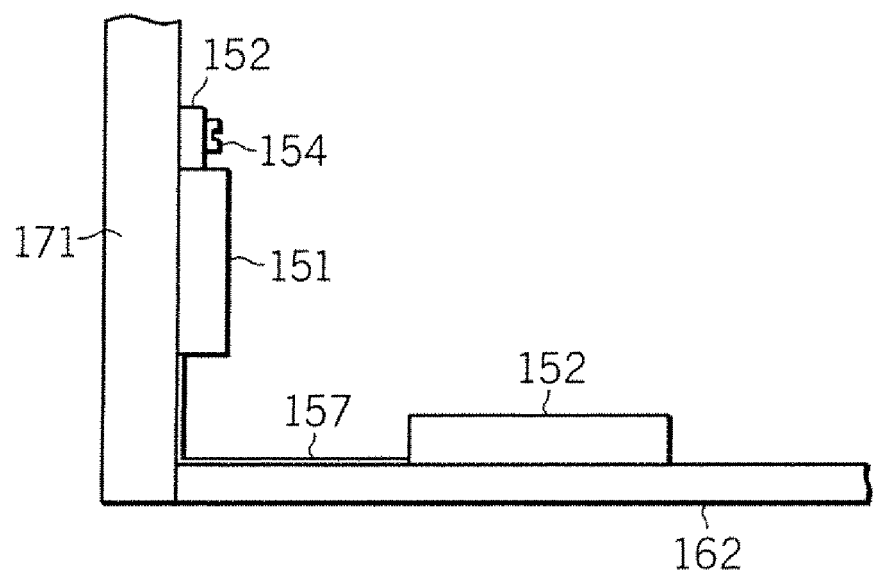
FIG. 19 illustrates a side view of the multi-chip molded array package of FIG. 16 attached to a different next level of assembly in accordance with the present invention.

FIG. 19 shows a side view of package 160 attached to a next level of assembly 167 in accordance with the present invention. In this embodiment, leads 157 are bent or shaped so that power device portion 151 is placed adjacent to a vertical heat sink structure or a cabinet 171. Power device portion 151 is attached to structure 171 using, for example, a pin, clip, screw 154 or the like.

Figure 20:
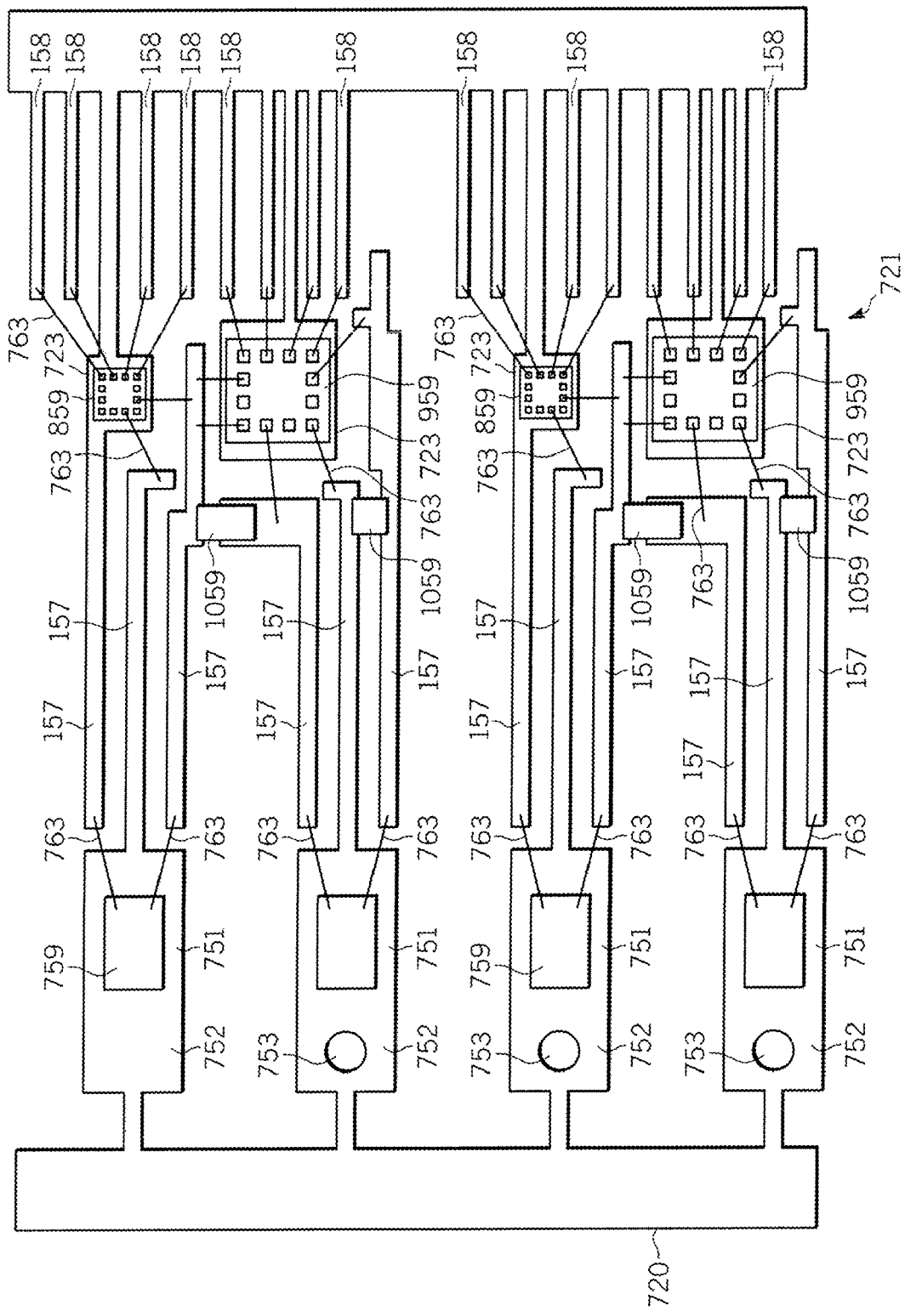
FIG. 20 illustrates a top view of an assembly structure for manufacturing the packages of FIGS. 16 and 17 in accordance with the present invention at an intermediate step in manufacture.

FIG. 20 shows a partial top view of an assembly structure or sub-assembly 710 for manufacturing the packages of FIGS. 16 and 17 in accordance with the present invention at an intermediate step in manufacture. The layout example shown is compatible with quad flat packaging assembly techniques. Structure 710 includes an array lead frame or main lead frame 720. By way of example, main lead frame 720 comprises a single gauge chemically milled or stamped sheet of a material such as a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such nickel-palladium and gold.

Main lead frame 720 includes an array or plurality of flag or elongated flag portions 751. First semiconductor devices 759 are attached to flag portions 751, and further connected or coupled to plurality of leads 157 using, for example, wire bonds 763 or conductive clips (not shown). First semiconductor devices 759 are attached to flag portions 751 using a solder attach layer, a conductive epoxy, or the like, or using an insulative layer, and process such as that described in conjunction with FIG. 5 is suitable for this attachment step. By way of example, devices 759 comprise power MOSFETS, insulated gate bipolar transistors, bipolar transistors, thyristors, diodes or the like. Elongated flag portions 751 further include tab portions 752 having through-holes 753. In alternative embodiment, tab portions 752 are provided without through-holes 753 as shown in the top portion in FIG. 20 to provide for clip mounting techniques.

Main lead frame 720 further includes an array or plurality of multi chip lead frames 721, which include a plurality of flags 723 and conductive leads 158. Electronic devices 859 and 959 are attached to flags 723 using insulative or conductive attach layers, and connective structures such as wire bonds connect devices 859 and 959 to conductive leads 157 and 158. By way of example, devices 859 and 959 comprise sensor, optical, logic, control, or memory devices, combinations thereof, or the like. Components 1059 such as capacitive components may be used between adjacent conductive leads to provide, for example, circuit protection from electrostatic discharge events.

Figure 21:
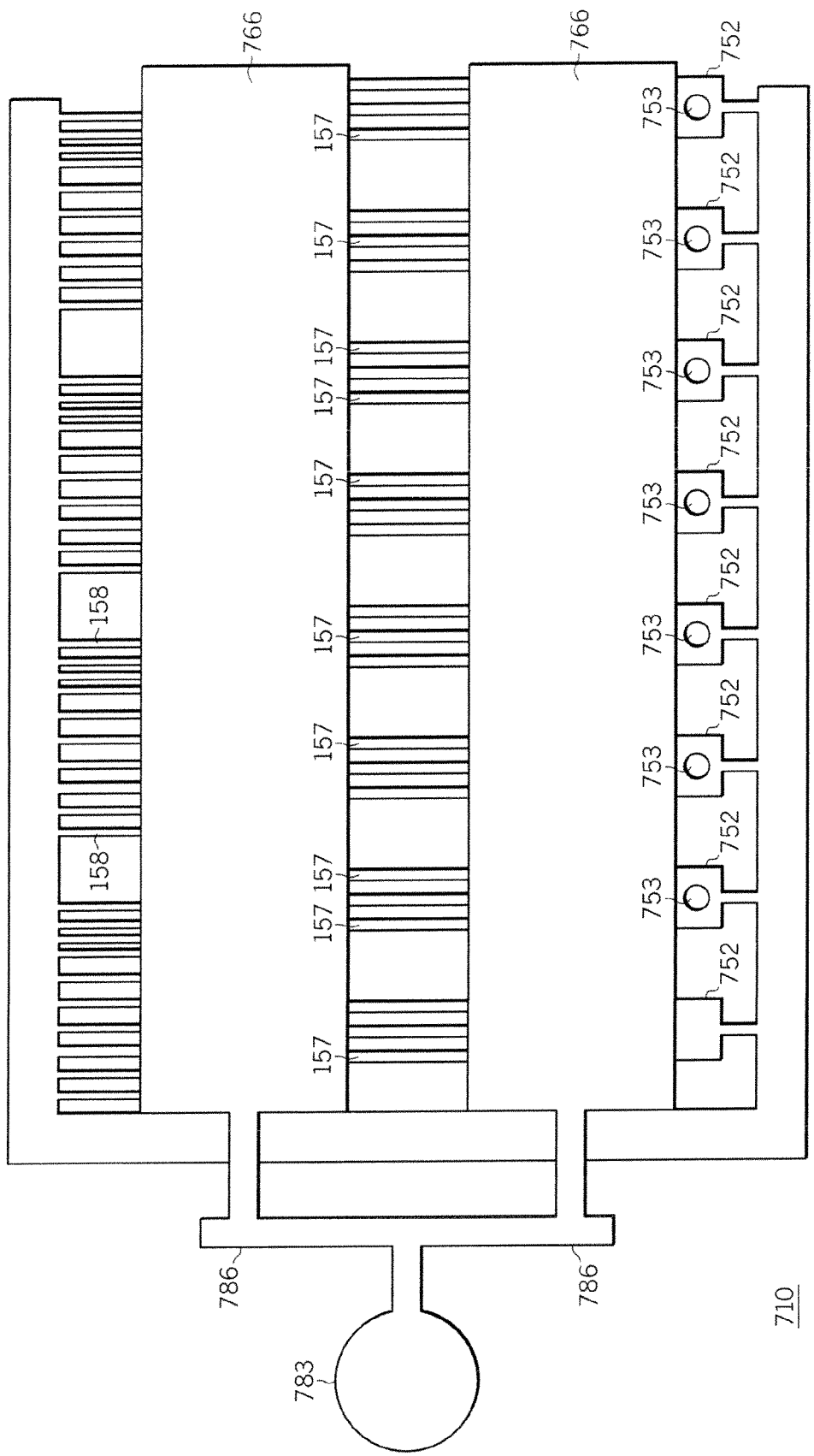
FIG. 21 illustrates a top view of the assembly structure of FIG. 20 after further processing in accordance with the present invention.

FIG. 21 shows a top view of assembly structure 710 during further processing in accordance with the present invention. In this step, assembly structure 710 is placed in a molding apparatus such as a transfer molding device. A solid resin pellet is placed in cull or pot 783. When pot 783 is heated to melt the solid resin pellet, the liquefied resin material is forced from pot 783 through runners 786 into the slot mold cavities to form encapsulating layers 766, while leaving portions of leads 157 and 158 and tab portions 752 with through-holes 753 exposed in accordance with the present invention. It is understood that in one embodiment, the lower surfaces of flags 751 and/or 723 and the lower surfaces of leads 158 are not encapsulated.

Figure 22:
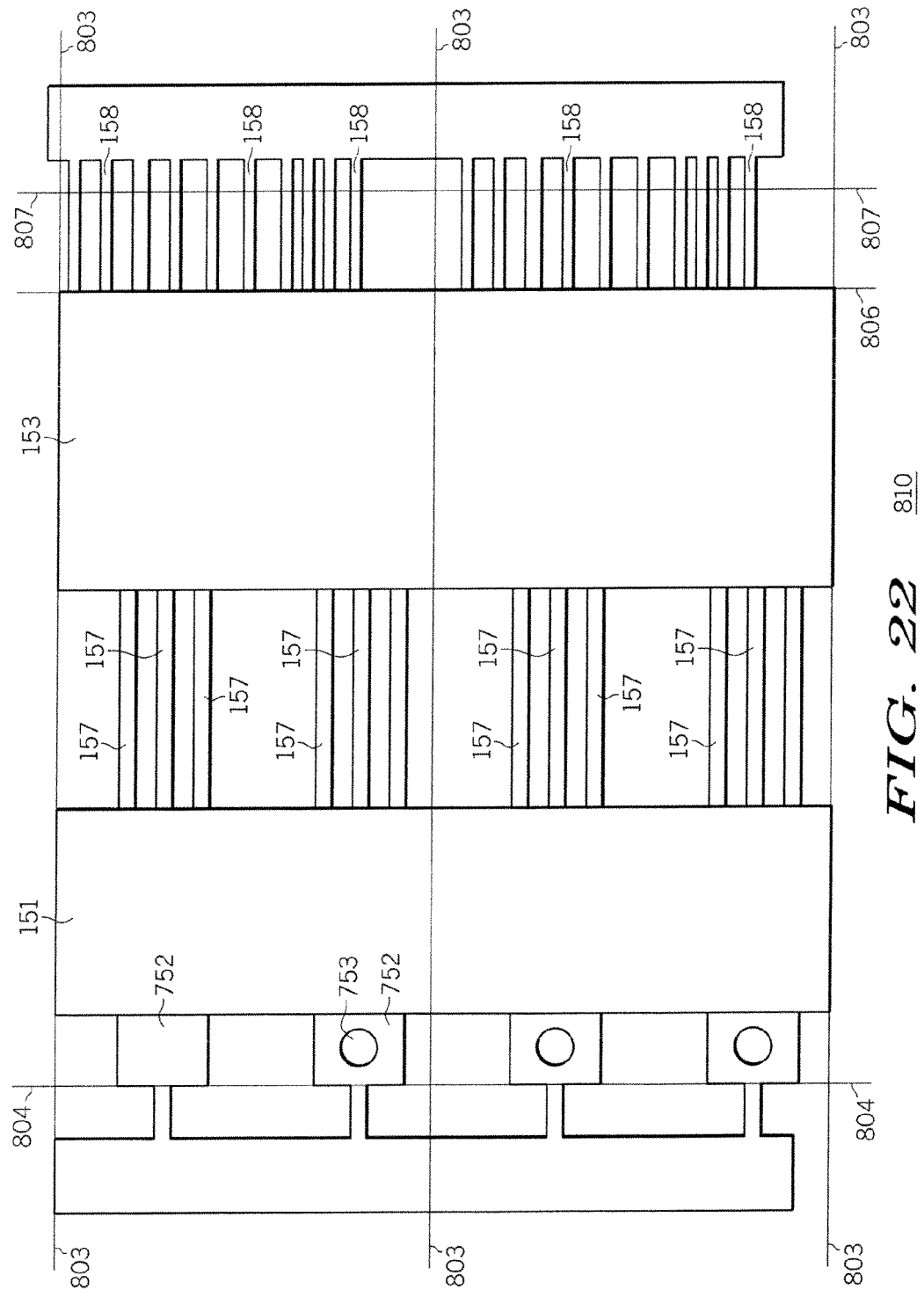
FIG. 22 illustrates a top view of the assembly structure of FIG. 21 after further processing in accordance with the present invention.

FIG. 22 shows a top view of integrated multi-chip molded array package structure 810 having tabs 752 with through-holes 753 in accordance with the present invention prior to separation. Singulation lines 803, 804, 806, and 807 represent examples of separation locations for separating structure 810 into separate multi-chip molded array packages. Lines 803 are horizontal or first directional cut lines for separating individual packages and pass through molded portions of the devices. Line 804 is a vertical or second directional cut line for separating tab portions 752 from the main lead frame. Optional cut line 806 is a vertical or second directional cut line that provides a no-lead or leadless embodiment such as that shown in FIG. 16 in accordance with the present invention. Optional cut line 807 is a vertical or second directional cut line that provides a leaded embodiment such as that shown in FIG. 17 in accordance with the present invention.

Thus, it is apparent that there has been provided, in accordance with the present invention, a structure and method for forming molded array package having an exposed tab with a through-hole. The package and method provide optional embodiment flexibility including no-lead devices, leaded devices, and multiple-chip devices including devices having multiple molded portions with leaded interconnects.

Although the invention has been described and illustrated with reference to specific embodiments thereof, it is not intended that the invention be limited to these illustrative embodiments. For example, the exposed leads of devices according to the present invention may be flat or bent or shaped (e.g., gull wing shaped) at various angles according to assembly requirements.

What is claimed is:

1. A method for forming molded array package devices comprising the steps of:
   providing a main lead frame having a plurality of flags with tab portions and a plurality of leads in spaced relationship with the plurality of flags;
   mounting electronic chips to the plurality of flags;
   coupling the electronic chips to the plurality of leads;
   encapsulating the main lead frame wherein an encapsulation layer covers all of the electronic chips mounted to the plurality of flags, and wherein the encapsulation layer runs continuously between each adjacent flag adjacent to the electronic chips while leaving portions of the plurality of leads exposed to provide a molded array package assembly; and
   separating the molded array package assembly into separate molded array package devices by separating the molded array package assembly through the encapsulation layer between at least two adjacent flags adjacent to the electronic chips, wherein the step of separating includes cutting through the plurality of flag portions, and wherein the step of separating includes separating through the plurality of leads to form leadless molded array packages.

2. A process for forming a flat pack structure comprising the steps of:
   providing an array lead frame having a plurality of elongated flag portions with tabs and a plurality of leads;
   attaching electronic chips to the elongated flag portions;
   coupling the electronic chips to the plurality of leads;
   forming a continuous encapsulating layer over portions of the elongated flags portions while leaving the tabs and portions of the plurality of leads exposed to provide a molded assembly; and
   singulating the molded assembly into separate packages by separating through the plurality of elongated flag portions, through the continuous encapsulating layer between one elongated flag portion and an adjacent elongated flag portion in a first direction, and through the plurality of leads in a second direction substantially perpendicular to the first direction to provide flat pack structures with exposed tab portions and with a no-lead configuration.

3. A multi-chip packaged device comprising:
   a first flag having a tab portion
   a first electronic chip attached to the first flag;
   a first plurality of conductive leads in spaced relationship with the first flag, wherein the first electronic chip is coupled to at least a portion of the first plurality of conductive leads;
   a second flag in spaced relationship with the first plurality of conductive leads;
   a second plurality of conductive leads in spaced relationship with the second flag;
   a second electronic chip attached to the second flag and coupled to the first and second plurality of conductive leads, wherein the second electronic chip provides a function different from the first electronic chip;
   a first encapsulating layer covering the first flag, the first electronic chip and portions of the first conductive leads to form a first packaged device; and
   a second encapsulating layer covering the second flag, the second electronic chip, and other portions of the first conductive leads to form a second flat packaged device, wherein remaining portions of the first conductive leads are exposed between the first and second packaged devices, and wherein at least one of the first plurality of conductive leads connects the first and second packaged devices together.

4. The device of claim 3, wherein the tab portion is exposed for attaching to a next level of assembly.

5. The device of claim 3, wherein the second plurality of conductive leads are exposed and extend outwardly from the second flat package device.

6. The device of claim 3, wherein the second plurality of conductive leads are configured as leadless connective portions.

7. A process for forming a multi-chip molded structure comprising the steps of:
   providing an array lead frame having a plurality of first flag portions with tab portions, a plurality of second flag portions without tab portions, and a plurality of leads, wherein the plurality of leads includes conductive leads that extend between the plurality of first flag portions and the plurality of second flag portions;
   attaching electronic components to the plurality of first flag portions and the plurality of second flag portions;
   coupling the electronic components to the plurality of leads;
   forming a first continuous encapsulating layer overlying portions of the plurality of first flag portions while leaving the tab portions exposed;
   forming a second continuous encapsulating layer overlying portions of the plurality of second flag portions; and
   singulating through the first and second continuous encapsulating layers in a first direction to provide a first molded device portion connected to a second molded device portion by the conductive leads.

8. The method of claim 7, wherein the step of providing the array lead frame includes providing the array lead frame, wherein at least a portion of the plurality of first flag portions include tab portions, and wherein the step of forming the first continuous encapsulating layer includes forming the first continuous encapsulating layer, wherein at least one tab portion is exposed.

9. The method of claim 7, wherein the step of singulating includes singulating through the first and second continuous encapsulating layers to provide a first molded device that includes more than one first flag portion.

10. The method of claim 7, wherein the step of singulating includes singulating through the first and second continuous encapsulating layers to provide a second molded device that includes more than one second flag portion.

11. The method of claim 7, wherein the step of singulating includes singulating in a second direction so that the second molded device includes leadless connective portions on one side.

* * * * *